United States Patent
Schmit et al.

(10) Patent No.: US 10,418,307 B2
(45) Date of Patent: Sep. 17, 2019

(54) ELECTRONIC ASSEMBLY WITH A DIRECT BONDED COPPER SUBSTRATE

(71) Applicant: Deere & Company, Moline, IL (US)

(72) Inventors: Christopher J. Schmit, Fargo, ND (US); Richard E. Wainwright, West Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 0 days.

(21) Appl. No.: 15/852,616

(22) Filed: Dec. 22, 2017

(65) Prior Publication Data
US 2019/0198420 A1    Jun. 27, 2019

(51) Int. Cl.
| | |
|---|---|
| H01L 23/48 | (2006.01) |
| H01L 23/373 | (2006.01) |
| H01L 23/50 | (2006.01) |
| H01L 23/34 | (2006.01) |
| H01L 23/00 | (2006.01) |
| G01R 19/00 | (2006.01) |
| H01L 25/07 | (2006.01) |

(52) U.S. Cl.
CPC ...... *H01L 23/3735* (2013.01); *G01R 19/0084* (2013.01); *H01L 23/34* (2013.01); *H01L 23/50* (2013.01); *H01L 24/48* (2013.01); *H01L 25/072* (2013.01); *H01L 2224/48225* (2013.01); *H01L 2924/19043* (2013.01); *H01L 2924/19105* (2013.01)

(58) Field of Classification Search
CPC ..... H01L 23/3735; H01L 23/34; H01L 23/50; H01L 24/48; H01L 25/072; H01L 2224/48225; H01L 2924/19043; H01L 2924/19105; G01R 19/0084
See application file for complete search history.

(56) References Cited

U.S. PATENT DOCUMENTS

| | | | |
|---|---|---|---|
| 7,164,263 B2 | 1/2007 | Yakymyshyn et al. | |
| 10,032,732 B1 * | 7/2018 | DiMarino | H01L 23/66 |
| 2004/0026778 A1 * | 2/2004 | Grant | H02M 7/003 257/706 |
| 2011/0089931 A1 | 4/2011 | Podlisk et al. | |

(Continued)

FOREIGN PATENT DOCUMENTS

EP    0609528 A1    8/1994

OTHER PUBLICATIONS

"Automotive Shunt-Based ±500-A Precision Current Sensing Reference Design." System Overview [online]. Texas Instruments Incorporated, 2017 [retrieved on Apr. 11, 2018]. Retrieved from the Internet: <URL:http://www.ti.com/lit/ug/tiducj6a/tiducj6a.pdf>.

(Continued)

*Primary Examiner* — Peter Bradford

(57) ABSTRACT

A metallic island is disposed between a first metallic bus and a second metallic bus. The first metallic strip is isolated from the metallic island by a first dielectric barrier. At least a parallel portion of the first metallic strip is generally parallel to the first metallic bus, the second metallic strip isolated from the second metallic bus by a second dielectric barrier. Each first semiconductor terminals that are coupled to the first metallic bus and to the metallic island. Each second semiconductor has terminals coupled to the metallic island and to the second metallic bus.

22 Claims, 4 Drawing Sheets

(56) References Cited

U.S. PATENT DOCUMENTS

| | | | |
|---|---|---|---|
| 2011/0127888 A1* | 6/2011 | Tunzini | H01L 24/49 |
| | | | 310/68 D |
| 2011/0292617 A1 | 12/2011 | Darroman et al. | |
| 2014/0246681 A1* | 9/2014 | Das | H01L 27/0629 |
| | | | 257/77 |
| 2016/0056132 A1 | 2/2016 | Bayerer et al. | |
| 2018/0183321 A1* | 6/2018 | Cyr | H01L 23/48 |

OTHER PUBLICATIONS

Search Report issued in counterpart application No. EP18206009.5, dated May 28, 2019 (11 pages).

* cited by examiner

ELECTRONIC ASSEMBLY WITH A DIRECT BONDED COPPER SUBSTRATE

DISCLOSURE

This disclosure relates to an electronic assembly with a direct bonded copper substrate.

BACKGROUND

In the some prior art, a direct copper bonded (DCB) substrate refers to a circuit board in which a copper layer (e.g., copper foil) and aluminum oxide layer are directly bonded or fused in a process at a sufficiently high temperature. In certain embodiments, the electronic assembly includes heat-generating components, such as semiconductors, current measurement devices, or both that generate thermal loads that can result in heating of the substrate and circuit traces on the substrate. Because of the heat-generating components, additional heat dissipation may be required to maintain a target operating temperature range of the electronic assembly. If the target operating temperature range is exceeded, certain electronic components or dielectric insulators may fail or not perform in accordance with specifications. Thus, there is a need for an electronic assembly with a direct bonded copper substrate configured for improved thermal performance.

SUMMARY

In accordance with one embodiment, an electronic assembly comprises a direct copper bonded dielectric substrate comprising a dielectric layer. A first metallic bus overlies the dielectric layer, where the first metallic bus has a bus width. A second metallic bus overlies the dielectric layer and is generally parallel to the first metallic bus. The first metallic bus and the second metallic bus are associated with direct current terminals. A metallic island is disposed between the first metallic bus and the second metallic bus. A first metallic strip has a strip width that is less than the bus width. The first metallic strip is isolated from the metallic island by a first dielectric barrier (e.g., where at least a parallel portion of the first metallic strip is generally parallel to the first metallic bus). A second metallic strip has the strip width that is less than the bus width, the second metallic strip isolated from the second metallic bus by a second dielectric barrier. Each first semiconductor has at least one primary terminal and a secondary terminal, where the at least one primary terminal is coupled to the first metallic bus and the secondary terminal is coupled to the metallic island. Each second semiconductor has at least one primary terminal and a secondary terminal, where the at least one primary terminal is coupled to the metallic island and the secondary terminal is coupled to the second metallic bus.

DETAILED DESCRIPTION

Figure 1:
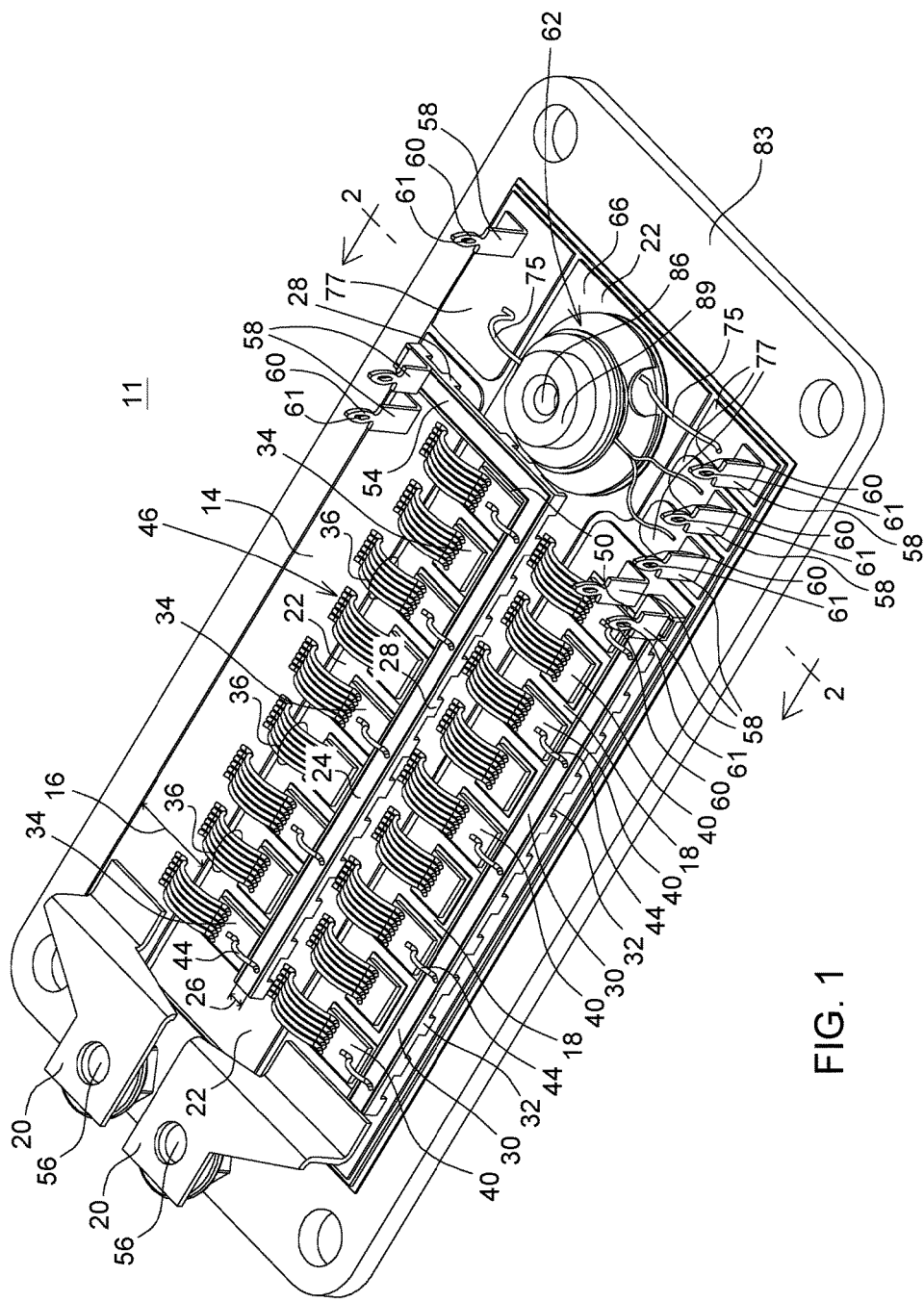
FIG. 1 is a first perspective view of one embodiment of the electronic assembly.
Figure 2:
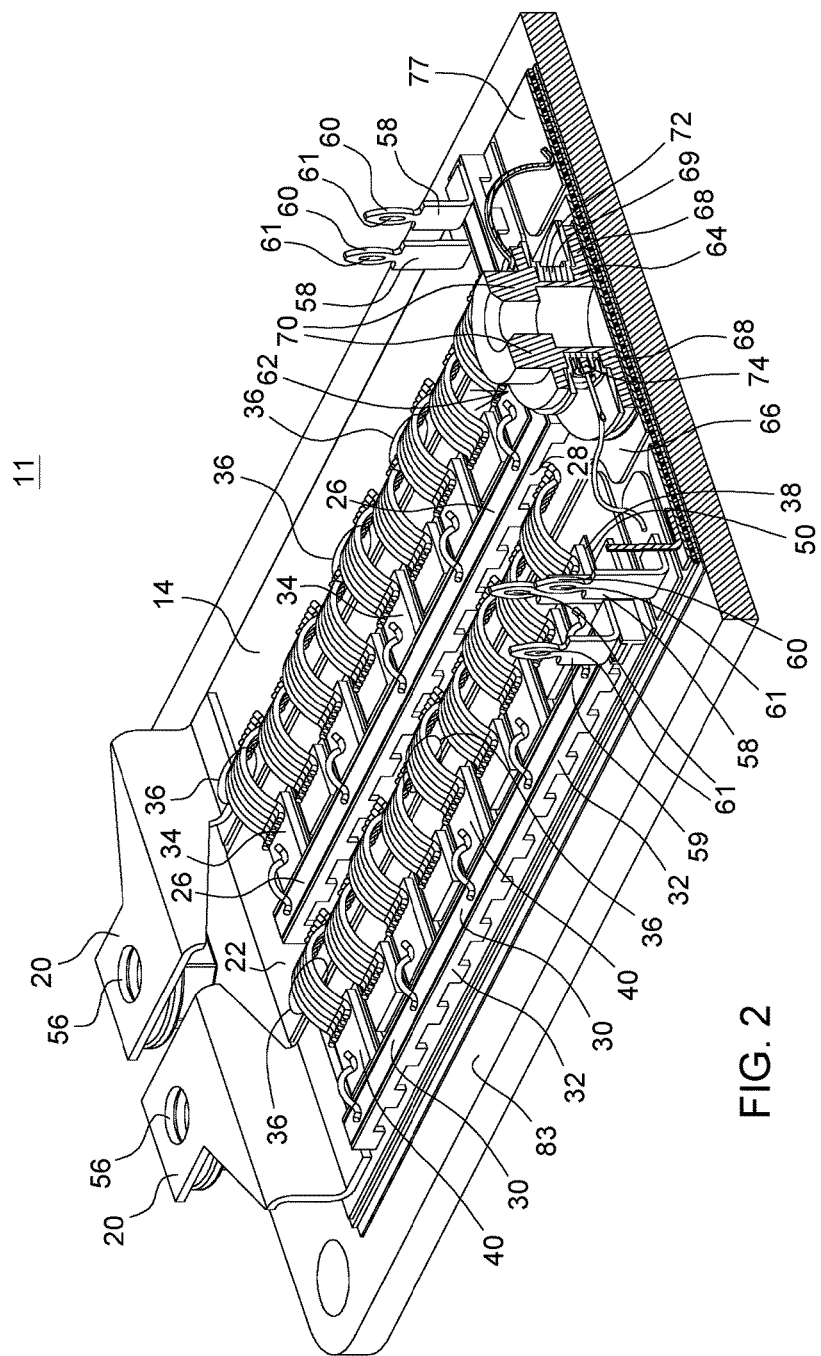
FIG. 2 is second perspective view of the embodiment of the electronic assembly shown in FIG. 1.

In accordance with one embodiment, FIG. 1 illustrates an electronic assembly 11 that comprises a dielectric layer 12 and a first metallic bus 14 overlying the dielectric layer 12. The first metallic bus 14 has a bus width 16 (e.g., first bus width) and a bus height or thickness. A second metallic bus 18 overlies the dielectric layer 12 and is generally parallel to the first metallic bus 14, where the first metallic bus 14 and the second metallic bus 18 are associated with direct current terminals 20. For example, the direct current terminals 20 are associated with positive direct current input and negative direct current input to power the direct current bus.

In one embodiment, a metallic island 22 is disposed between the first metallic bus 14 and the second metallic bus 18. The metallic island 22 is electrically isolated from the first metallic bus 14 and the second metallic bus by an intervening dielectric region of the dielectric layer 12. In one example, the metallic island 22 represents an output bus or is electrically connected to or in common with the output bus. The metallic island 22 or output bus is associated with a respective output terminal, output terminal pad, or output conductive pad 66.

In one configuration, an optional current measurement device or current shunt resistor 62 overlies a portion of the metallic island 22 or the output conductive pad 66 associated with the output, such as one phase of an inverter or a converter that embodies the electronic assembly 11. In particular, the current shunt resistor 62 can be soldered, brazed or otherwise electrically and mechanically connected to the metallic island 22 or output terminal pad via a solder layer 13. In one configuration, the space above the output conductive pad 66 or the metallic island 22 that might otherwise be empty can be filled with the optional current measurement device (e.g., current shunt resistor 66) to achieve greater circuitry density or reduced package size of the electronic assembly 11 than otherwise possible. In another configuration, the optional current measurement device or current shunt resistor 62 functions simultaneously as both an output terminal and a current shunt resistor 62. The current shunt resistor 62 has a central bore 86 that may be substantially cylindrical, tapped with threads or threaded to receive a fastener associated with a conductive cable or output conductor (e.g., conductor that terminates in a connector with an opening or eyelet for receiving the fastener).

The current shunt resistor 62 can operate both as current shunt (e.g., with one terminal of the current shunt resistor 62 coupled to ground) and an output terminal, where the current shunt has bond wires connected it to conductive pads 77 on the direct copper bonded dielectric substrate 10 for "Kelvin connections." "Kelvin connections" support accurate voltage measurement across the terminals of the shunt resistor 62 because the parasitic or ancillary voltage drop associated with the resistance or impedance of the surrounding bus structure is reduced or eliminated from the voltage measurement.

A first metallic strip 24 (e.g., an elevated first metallic strip) has a strip width 26 that is less than the bus width 16 (e.g., first bus width). The first metallic strip 24 is electrically isolated from the metallic island 22 by a first dielectric barrier 28 (e.g., dielectric bridge). In one embodiment, the first metallic strip 24 comprises an elevated first metallic strip 24 that is elevated above the substrate, the metallic island 22, or both by the dielectric barrier (e.g., dielectric bridge). For example, the first dielectric barrier 28 may be configured as a dielectric bridge with piers, feet or other vertical supports 29 that rest on, are secured to or that are adhesively bonded to the metallic island 22.

A second metallic strip 30 has a strip width 26 (e.g., second strip width) that is less than the bus width 16. The second metallic strip 30 is electrically isolated from the second metallic bus 18 by a second dielectric barrier 32 (e.g., dielectric bridge). The second metallic strip 30 is spaced apart from the first metallic strip 24 and is electrically isolated from the first metallic strip 24. In one embodiment, the second metallic strip 30 comprises an elevated second metallic strip 30 that is elevated above the substrate, the metallic island 22 or both by the dielectric barrier (e.g., dielectric bridge). For example, the second dielectric barrier 32 may be configured as a dielectric bridge with piers, feet or other vertical supports 29 that rest on, are secured to or that are adhesively bonded to the second metallic bus 18.

A set (e.g., row) of one or more first semiconductors 34 is associated with the electronic assembly 11. Each first semiconductor 34 has at least one primary terminal 36, a secondary terminal 38 (e.g., a conductive pad on bottom of semiconductor 34) and a tertiary terminal 44. With respect to one or more first semiconductors 34, at least one primary terminal 36 is coupled to the first metallic bus 14; the secondary terminal 38 (e.g., conductive pad on bottom of semiconductor 34) is coupled to the metallic island 22, and the tertiary terminal 44 is coupled to the first metallic strip 24. In one embodiment, the primary terminal 36 and the secondary terminal 38 are collectively referred to as switched terminals of each corresponding first semiconductor, whereas the tertiary terminal 44 comprises a control terminal of each corresponding first semiconductor 34. As illustrated, the secondary terminal 38 comprises a conductive pad that is integral with the packaging of the first semiconductor 34. In one embodiment, if the first semiconductor 34 comprises a transistor; the switched terminals comprise an emitter and collector, or a source and drain. As illustrated, the at least one primary terminal 36 may comprise multiple leads (e.g., wire bonds) that are configured in parallel to increase the current carrying capacity of the first semiconductor device with respect to a lesser number of leads.

A set (e.g., row) of one or more second semiconductors 40 is associated with the electronic assembly 11. Each second semiconductor 40 has at least one primary terminal 36, a secondary terminal 38 (e.g., a conductive pad on a bottom side of the second semiconductor 40), and a tertiary terminal 44. The at least one primary terminal 36 is coupled to the metallic island 22; the secondary terminal 38 is coupled to the second metallic bus 18, and the tertiary terminal 44 is coupled to the second metallic strip 30. In one embodiment, the primary terminal 36 and the secondary terminal 38 are collectively referred to as switched terminals of each corresponding second semiconductor 40, whereas the tertiary terminal 44 comprises a control terminal of each corresponding second semiconductor. As illustrated, the secondary terminal 38 comprises a conductive pad that is integral with the packaging of the second semiconductor 40. As illustrated, the at least one primary terminal 36 may comprise multiple leads (e.g., wire bonds) that are configured in parallel to increase the current carrying capacity of the second semiconductor device 40 with respect to a lesser number of leads.

In accordance with FIG. 1, one embodiment of an electronic assembly 11 comprises a dielectric layer 12 of direct bonded copper dielectric substrate 10 (e.g., ceramic substrate) and a first metallic bus 14 overlying a first side of the dielectric layer 12. The first metallic bus 14 has a bus width 16. A second metallic bus 18 overlies the dielectric substrate and is generally parallel to the first metallic bus 14, where the first metallic bus 14 and the second metallic bus 18 are associated with direct current terminals 20. The second metallic bus 18 has a bus width that may be equivalent to or different than the bus width 16 of the first metallic bus 14. A first metallic strip 24 has a strip width 26 that is less than the bus width, where at least a parallel portion of the first metallic strip 24 is generally parallel to the second metallic strip 30 (e.g., or first metallic bus 14). A second metallic strip 30 has the strip width 26 that is less than the bus width, where at least a parallel portion of the second metallic strip 30 is generally parallel to the first metallic strip 24 (e.g., or the first metallic bus 14). The strip width 26 of the first metallic strip 24 may be equivalent to or different than the strip width of the second metallic strip 30.

In one embodiment, a switching assembly comprises a set of one or more first semiconductors 34 and another set of one more second semiconductors 40 in conjunction with their respective conductive traces (14, 18, 22) on the substrate 10. As illustrated, the first semiconductors 34 and the second semiconductors 40 are arranged in respective rows. In one embodiment, each first semiconductor 34 has at least one primary terminal 36, a secondary terminal 38, and tertiary terminal 44 that are coupled to corresponding circuit traces of the direct copper bonded dielectric substrate 10. A set of one or more second semiconductors 40 has at least one primary terminal 36 and a secondary terminal 38. In one embodiment, each second semiconductor 40 has at least one primary terminal 36, a secondary terminal 38, and tertiary terminal 44 that are coupled to corresponding circuit traces (14, 18, 22) of the direct copper bonded dielectric substrate.

Figure 3:
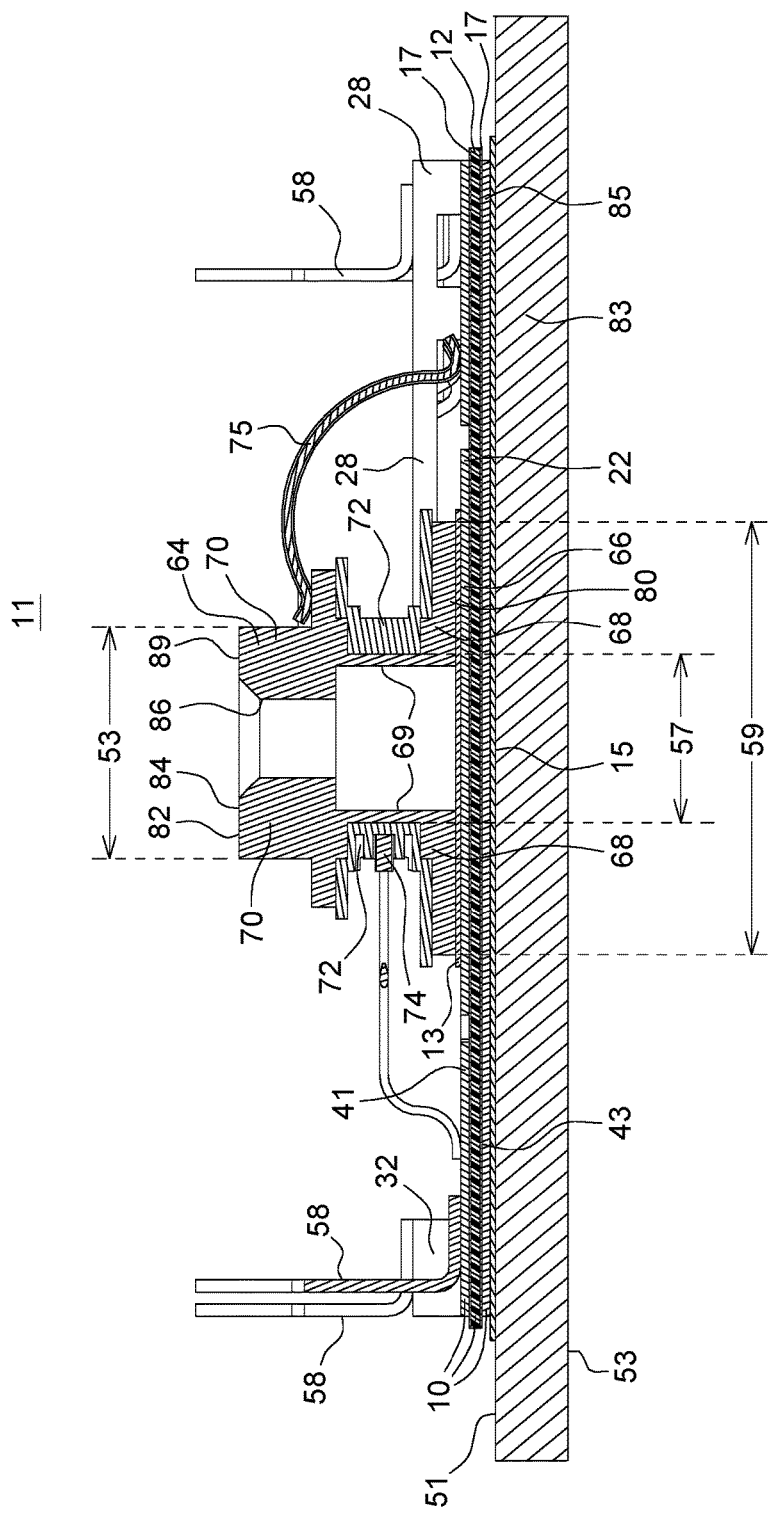
FIG. 3 is third perspective view of the embodiment of the electronic assembly shown in FIG. 1.

In one embodiment, a second side 43 of the direct bonded copper dielectric substrate 10 is opposite the first side 41; the second side 43 is associated with a copper layer or copper alloy layer that is directly bonded to a base layer 17 on the dielectric layer 12. Accordingly, the direct bonded copper dielectric substrate 10 has a double-sided configuration with conductive traces on the first side 41 and the second side 43. As shown in FIG. 3, the heat sink 83 is soldered or brazed to the second side 43 of the direct bonded copper dielectric 10 via a solder layer 15, where the second side 43 has a metallic layer 85, such as a metallic ground plane or a conductive pad of a size and shape that corresponds to and mates with the respective size and shape of the heat sink 83. In an alternate embodiment, the heat sink 83 may be welded, fused, direct bonded, thermally and mechanically bonded, or metallurgically bonded to the second side 43.

In one embodiment, the heat sink 83 comprises a generally planar heat sink 83 (e.g., a metal, metal alloy, or aluminum heat sink). An upper side 51 of the heat sink 83 faces or contacts the dielectric substrate 10, whereas a lower side 53 of the heat sink 83 may comprise an exterior portion of the electronic assembly 11 for dissipation of thermal energy to the ambient environment via air-cooling, liquid cooling or both. For example, in an alternate embodiment the lower side 53 of the heat sink 83 may have fins, elevations or protrusions that extend outward from a generally planar surface 84 to enhance heat dissipation by air-cooling.

In one embodiment, the dielectric substrate 10 comprises a direct copper bonded (DCB) substrate. The DCB dielectric substrate 10 refers to a circuit board in which a copper layer (e.g., copper foil) and base layer 17, where the base layer 17 and the copper layer are directly bonded or fused in a process at a sufficiently high temperature. The base layer 17 is composed of aluminum oxide (i.e., alumina), aluminum nitride, aluminum silicon carbide, or other oxide, carbide, or nitride compounds. The copper layer and base layer 17 can be etched, removed, formed, or otherwise configured into conductive traces, such as the first metallic bus 14, the second metallic bus 18, metallic island 22. Further, adhesive metal foils, photolithography, chemical processes, electro plating, electroless plating, or three-dimensional printing can be used to form other conductive traces, such as the first metallic strip 24 and the second metallic strip 30. In certain embodiments, the electronic assembly 11 includes heat-generating components, such as semiconductors, current measurement devices, or both.

On a DCB dielectric substrate 10, sometimes the conductor or conductive trace can be made thicker (higher), wider, or both to support a corresponding threshold current-carrying capacity. In one embodiment, the thickness or height of any metallic trace can be increased by using a thicker copper foil, metal sputtering, electroless plating, electroplating, deposition or other processes. If consistent with applicable design limitations on inductance in the conductive traces along with available space on the DCB dielectric substrate 10, the DCB dielectric substrate 10 can be configured to have higher thermal conductivity and higher current carrying capacity than a conventional circuit board, such as ceramic or fiberglass board with copper traces. Here, the configuration of the conductive traces, buses, strips, or conductors on the substrate supports thermal performance and heat dissipation that is suitable for power electronics applications.

In one embodiment, the first metallic bus 14, the second metallic bus 18, and the first metallic island 22 are composed of copper or copper alloy directly bonded to the dielectric layer 12 via a base layer 17. The first metallic bus 14, the second metallic bus 18, the first metallic strip 24, and the second metallic strip 30 are composed of copper or a copper alloy.

Each one of the first semiconductors 34 comprises a tertiary terminal 44 coupled to the first metallic strip 24. Each one of the second semiconductors 40 comprises another tertiary terminal 44 coupled to the second metallic strip 30. With respect to the first semiconductors 34, tertiary terminals 44 comprise wire bonds 46 directly bonded to corresponding first metallic strip 24 and the second metallic strip 30. At least one primary terminal 36 comprises a parallel set of multiple wire bonds 46 to support greater current-handling capacity.

The secondary terminal 38 of the first semiconductor comprises a conductive pad on a lower surface 50 of the first semiconductor. The secondary terminal 38 of the second semiconductor comprises a conductive pad on a lower surface 50 of the second semiconductor 40.

The primary terminal 36 and the secondary terminal 38 comprise switched terminals of each one of the first semiconductors 34 and wherein the tertiary terminal 44 comprises a control terminal of each of the first semiconductors 34. The primary terminal 36 and the secondary terminal 38 comprise switched terminals of each one of the second semiconductors and wherein the tertiary terminal 44 comprises a control terminal of each of second first semiconductors 34.

The first metallic strip 24 has perpendicular portion 54 that substantially perpendicular to the parallel portion (e.g., 24). The first metallic bus 14 and the second metallic bus 18 are associated with the direct current terminals 20 with corresponding bores 56. Each one of first metallic bus 14, the second metallic bus 18, the first metallic strip 24 and the second metallic strip 30 has a connector tab 58 extending normal to or substantially perpendicular to a corresponding one of first metallic bus 14, the second metallic bus 18, the first metallic strip 24 and the second metallic strip 30. In one configuration, each connector tab 58 terminates in a corresponding substantially oval portion 60 with a corresponding oval opening.

In one embodiment, a current measurement system is associated with or mounted in the electronic assembly 11. For example, the current measurement system may be associated with a switching assembly to form the electronic assembly 11. In one embodiment, the current measurement system comprises a current shunt resistor 62, alone or in combination, with a current measurement device, which is described in conjunction with FIG. 4 in greater detail.

In one embodiment, a current shunt resistor 62 is a generally cylindrical mounted on the dielectric substrate 10 and is spaced apart from the first semiconductors 34 and the second semiconductors 40. For example, the current shunt resistor 62 further comprises a first annular member 64 overlying the metallic island 22 or an outlet conductive pad 66 on the dielectric layer 12. The first annular member 64 is composed of an electrically conductive material, such as metal or a metal alloy. The first annular member 64 has a base portion 68, an intermediate portion 69 above the base portion 68, and an outer portion 70 above the intermediate portion 69 or neck. The intermediate portion 69 or neck may have an intermediate outer diameter 57 that it is less than a first outer diameter 59 of the first annular member 64 or a second outer diameter 53 of the second annular member 72. Accordingly, the thinner wall of the intermediate portion 69 with the intermediate outer diameter 57 provides a higher resistance or impedance (e.g., for an alternating current output of an output phase of an inverter) to the output signal; hence, a greater voltage drop than would occur with an entirely cylindrical current shunt resistor 62.

In one embodiment, a second annular member 72 is over-molded, molded around or coaxially engages the intermediate portion 69 or neck of the first annular member 64. The second annular member 72 is composed of a dielectric material, wherein terminals of the current shunt resistor 62 are electrically and mechanically connected the base portion 68 and the outer portion 70.

In an alternate embodiment, the second annular member 72 is composed of a flexible elastomer that does not need to be over-molded or molded on the first annular member 64, but that can elastically and non-deformably expand to fit around the first annular member 64.

In one embodiment, a temperature sensor 74 is embedded in the second annular member 72. In one illustrative example, terminals of the temperature sensor 74 and the terminals of the current shunt resistor 62 are connected to corresponding pads 77 via wire bonds 75 or conductors. During operation of the electrical assembly 10, the current shunt resistor 62 heats up and the electrical conductivity of the conductor or material can change. The temperature sensor 74 can measure the true observed temperature of the current shunt resistor 62 to correct for current offset because of the temperature-dependent conductivity changes. The temperature sensor 74 can be placed in or embedded in the second annular member 72 as close as possible to the critical spot of the current transducer for proper temperature measurement.

In one configuration, the second annular member 72 is composed of dielectric material, such as plastic, a polymer or fiber-filled plastic or polymer, between the temperature sensor 74 and the output terminal (e.g., phase output terminal) for electrical isolation, where the thickness of the dielectric material between the temperature sensor 74 and the output terminal can be selected based on the maximum current and maximum voltage levels in the output terminal. In one embodiment, the plastic, polymer or fiber-filled plastic or polymer may be selected with a high modulus of elasticity such that the second annular member 72 does not deform in response to anticipated thermal and mechanical stresses associated with the current shunt resistor 62 and output terminal with cable or conductor attached via the central bore 86. Moreover, the plastic with a high modulus of elasticity provides structural support for the intermediate portion 69 against tensile stress, or shear stress, or both.

In one embodiment, a current shunt resistor 62 overlies a portion of the metallic island 22 or the output conductive pad 66 associated with an output signal of the electronic assembly 11. If the electronic assembly 11 comprises an inverter or converter, the inverter or converter may have an output signal that is an alternating current output signal, a pulse-width modulated output signal, or a sine-way signal. The current shunt resistor 62 has a central bore 86 and providing an output terminal 89 for the output signal. The current shunt resistor 62 is well-suited to function simultaneously as both an output terminal 89 and a current shunt resistor 62 to conserve spatial area on the surface of the direct bonded copper dielectric substrate 10 and to minimize the size of the electronic assembly 11 for vehicle applications, such as on-road highway or off-road vehicle applications. In one configuration, a lower portion 80 of the current shunt resistor 62 is soldered, brazed or otherwise electrically and mechanically connected to the metallic island 22 or output terminal pad; the upper portion 82 of the current shunt resistor 62 has a planar surface 84 and a bore 86 for receiving a cable or conductor that terminates in an electrical connector for electrical and mechanical attachment via a fastener. In one embodiment, terminals of the temperature sensor 74 and the terminals of the current shunt resistor 62 are connected to corresponding pads 77 via wire bonds 75 or other conductors.

Figure 4:
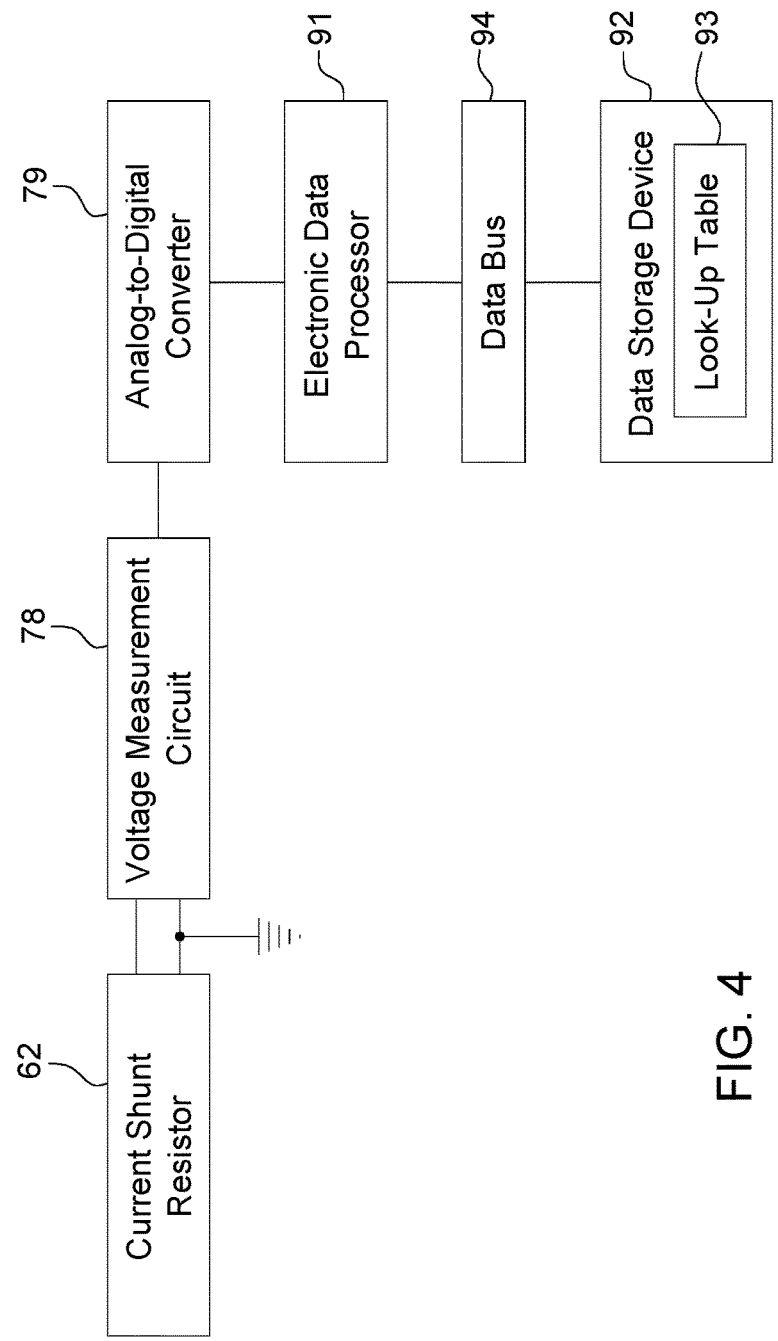
FIG. 4 is a block diagram of a current measurement system in accordance with the electronic assembly of FIG. 1.

In another example, as illustrated in FIG. 4, a voltage measurement circuit 78 is coupled to the terminals of the current shunt resistor 62 to measure a voltage drop across the current shunt resistor 62 that is proportional to a current flowing in the current shunt resistor 62. The current may be representative of the output current of one phase of an inverter if the electronic assembly 11 comprises an inverter. In one example, the voltage measurement circuit 78 detects a voltage drop between the terminals of the current shunt resistor 62 to estimate a corresponding current flowing in the current shunt resistor 62 in accordance with Ohm's law. The voltage measurement circuit 78 may be coupled to an input analog-to-digital converter 79 that converts the measured voltage drop to a digital value. An output of the analog-to-digital converter 79 is coupled to an electronic data processor 91 that communicates to a data storage device 92 via a data bus 94. The electronic data processor 19 may comprise a microcontroller, a microcontroller, a programmable logic array, a digital signal processor, an application specific integrated circuit, an arithmetic logic unit, or another data processor. In one embodiment, the data storage device 92 contains a look-up table 93, another data structure or software instructions (e.g., mathematical equations), that can be used to estimate the current based on the corresponding digital value of the measured voltage.

In one embodiment, the electronic assembly 11 can be constructed by first directly bonding copper or a copper layer to a base layer 17 of aluminum oxide, aluminum nitride, aluminum silicon carbide, or alumina. Second, the copper layer can be etched (e.g., chemically or with photolithography) to create the circuit traces, such as first metallic bus 14, second metallic bus 18, metallic island 22, output conductive pad 66, and other conductive pads 77, among other pads or conductors. Third, the first semiconductors 34 and second semiconductors 40 are soldered to their respective circuit traces or pads. Fourth, certain terminals of the first semiconductors 34 and second semiconductors are connected by bond wires to the corresponding circuit traces on the DCB dielectric substrate. Fifth, dielectric barriers (28, 32) are placed above the conductive traces (14, 18, 22) on the circuit board assembly or dielectric substrate 10 to support the first conductive strip 24 and second conductive strip 30 that can carry control signals to the first semiconductors 34 and the second semiconductors 40, respectively, (e.g., via the tertiary terminals 44). The combination of the first dielectric barrier 28 and the first conductive strip 24 may be referred to as a first signal carrying bridge. Similarly, the combination of the second dielectric barrier 32 and the second conductive strip 30 may be referred to as the second signal carrying bridge.

In one configuration, the assembly can be placed in an enclosure and filled with dielectric filler or potting, such as silicone potting to keep contaminants out, to maintain the dielectric insulation, and to support (structurally) the components, such as the first semiconductors 34, the second semiconductors 40 and the current shunt resistor 62.

In one embodiment, the electronic assembly 11 may comprise an inverter or converter, such as an inverter for converting direct current input into an alternating current output. The electronic assembly 11 is well-suited for keeping the semiconductor devices, the bus, connectors, current measurement device, and any other heat-generating components within a target operational temperature range for proper fully functional operation within the thermal specifications. By combining the current shunt resistor 62 and the output terminal into a single dual-purpose device, the current measurement system or current shunt resistor 62 uses less space on the circuit board or direct copper bonded dielectric substrate 10 than otherwise possible. Further, by combining the current shunt resistor 62 and the output terminal into single dual-purpose device, the total number of solder joints in the electronic assembly 11 is reduced by a solder joint that is obviated by the dual-purpose device. The reduction in the number of solder joints can be associated with greater reliability and longevity of the electronic assembly 11 because the elimination of any solder joints removes a potential for intermittent or unreliable electrical connections.

The resistance of the current resistor shunt is sufficiently low as the thermal loading or heat generating capacity of the current resistor shunt is minimal. Instead, the mass of the metallic body of the current resistor shunt that its extension above the circuit board or direct copper bonded dielectric substrate 10 facilitates cooling, heat sinking, or heat dissipation from the metallic island 22 or output pad 66, which tends to receive heat (e.g., via thermal conduction) from the semiconductor devices (e.g., 34, 40).

Having described one or more preferred embodiments, it will become apparent that various modifications can be made without departing from the scope of the invention as defined in the accompanying claims.

The following is claimed:

1. An electronic assembly comprising:
   a direct copper bonded dielectric substrate comprising a dielectric layer;

a first metallic bus overlying the dielectric layer, the first metallic bus having a bus width;

a second metallic bus overlying the dielectric layer and generally parallel to the first metallic bus, where the first metallic bus and the second metallic bus are associated with direct current terminals;

a metallic island between the first metallic bus and the second metallic bus;

a first metallic strip having a strip width that is less than the bus width, the first metallic strip isolated from the metallic island by a first dielectric barrier;

a second metallic strip having the strip width that is less than the bus width, the second metallic strip isolated from the second metallic bus by a second dielectric barrier;

a set of one or more first semiconductors, each first semiconductor having at least one primary terminal and a secondary terminal, the at least one primary terminal coupled to the first metallic bus and the secondary terminal coupled to the metallic island; and a set of one or more second semiconductors, each second semiconductor having at least one primary terminal and a secondary terminal, the at least one primary terminal coupled to the metallic island and the secondary terminal coupled to the second metallic bus.

2. The electronic assembly according to claim 1 wherein the first metallic bus, the second metallic bus, and the first metallic island are composed of copper or copper alloy directly bonded to the dielectric layer via a base layer.

3. The electronic assembly according to claim 1 wherein the first metallic bus, the second metallic bus, the first metallic strip, and the second metallic strip are composed of copper or a copper alloy.

4. The electronic assembly according to claim 1 wherein each one of the first semiconductors further comprises a tertiary terminal coupled to the first metallic strip; wherein each one of the second semiconductors further comprises another tertiary terminal coupled to the second metallic strip.

5. The electronic assembly according to claim 4 wherein the tertiary terminals comprises wire bonds directly bonded to corresponding first metallic strip and the second metallic strip.

6. The electronic assembly according to claim 4 wherein the at least one primary terminal comprises a parallel set of multiple wire bonds to support greater current-handling capacity.

7. The electronic assembly according to claim 1 wherein the secondary terminal of the first semiconductor comprises a conductive pad on a lower surface of the first semiconductor, where the secondary terminal of the second semiconductor comprises a conductive pad on a lower surface of the second semiconductor.

8. The electronic assembly according to claim 1 wherein the primary terminal and the secondary terminal comprise switched terminals of each one of the first semiconductors and wherein the tertiary terminal comprises a control terminal of each of the first semiconductors.

9. The electronic assembly according to claim 1 wherein the primary terminal and the secondary terminal comprise switched terminals of each one of the second semiconductors and wherein the tertiary terminal comprises a control terminal of each of second first semiconductors.

10. The electronic assembly according to claim 1 wherein a parallel portion of the first metallic strip is generally parallel to the first metallic bus, and where first metallic strip has perpendicular portion that substantially perpendicular to the parallel portion.

11. The electronic assembly according to claim 1 wherein the first metallic bus and the second metallic bus are associated with the direct current terminals with corresponding bores.

12. The electronic assembly according to claim 1 wherein each one of first metallic bus, the second metallic bus, the first metallic strip and the second metallic strip has a connector tab extending normal to or substantially perpendicular to a corresponding one of first metallic bus, the second metallic bus, the first metallic strip and the second metallic strip.

13. The electronic assembly according claim 12 wherein the connector tab terminates in a substantially oval portion with a corresponding oval opening.

14. The electronic assembly according to claim 1 further comprising:

a current shunt resistor mounted on the dielectric substrate and spaced apart from the first semiconductors and the second semiconductors.

15. The electronic assembly according to claim 14 wherein the current shunt resistor further comprises:

a first annular member overlying the metallic island or a conductive pad on the dielectric layer, the first annular member composed of an electrically conductive material, the first annular member having a base portion, an intermediate portion above the base portion, and an outer portion above the intermediate neck portion; and a second annular member coaxially engaging the intermediate neck portion of the first annular member, the second annular member composed of a dielectric material, wherein terminals of the current shunt resistor are electrically and mechanically connected the base portion and the outer portion.

16. The electronic assembly according to claim 15 further comprising:

a temperature sensor embedded in the second annular member.

17. The electronic assembly according to claim 16 further comprising:

a plurality of terminals of the temperature sensor and the terminals of the current shunt resistor connected to pads via wire bonds.

18. The electronic assembly according to claim 15 further comprising:

a current measurement circuit coupled to the terminals of the current shunt resistor to measure a voltage drop across the current shunt resistor that is proportional to a current flowing in the current shunt resistor.

19. An electronic assembly comprising:

a direct copper bonded dielectric substrate comprising a dielectric layer;

a first metallic bus overlying the dielectric layer, the first metallic bus having a bus width;

a second metallic bus overlying the dielectric layer and generally parallel to the first metallic bus, where the first metallic bus and the second metallic bus are associated with direct current terminals;

a metallic island between the first metallic bus and the second metallic bus, the metallic island comprising an output terminal pad;

a first metallic strip having a strip width that is less than the bus width, the first metallic strip isolated from the metallic island by a first dielectric barrier;

a second metallic strip having the strip width that is less than the bus width, the second metallic strip isolated from the second metallic bus by a second dielectric barrier;

a set of one or more first semiconductors, each first semiconductor having at least one primary terminal and a secondary terminal, the at least one primary terminal coupled to the first metallic bus and the secondary terminal coupled to the metallic island;

a set of one or more second semiconductors, each second semiconductor having at least one primary terminal and a secondary terminal, the at least one primary terminal coupled to the metallic island and the secondary terminal coupled to the second metallic bus; and a current shunt resistor overlies a portion of the metallic island or the output terminal pad associated with an output signal of the electronic assembly, the current shunt resistor having a central bore and providing an output terminal for the output signal.

20. The electronic assembly according to claim 19 further comprising:

a lower portion of the current shunt resistor soldered, brazed or otherwise electrically and mechanically connected to the metallic island or output terminal pad; the upper portion of the current shunt resistor having a planar surface and a bore for receiving a cable or conductor that terminates in an electrical connector for electrical and mechanical attachment via a fastener.

21. The electronic assembly according to claim 20 wherein the current shunt resistor functions simultaneously as both an output terminal and a current shunt resistor to conserve spatial area on the surface of the direct bonded copper dielectric substrate.

22. The electronic assembly according to claim 19 wherein at least a parallel portion of the first metallic strip is generally parallel to the first metallic bus.

* * * * *